United States Patent [19]
Park et al.

[11] Patent Number: 5,824,883
[45] Date of Patent: Oct. 20, 1998

[54] BATTERY LEAKAGE SENSING SYSTEM

[75] Inventors: Byung-Gyu Park; Kyung-Joon Park, both of Kyunggi-do, Rep. of Korea

[73] Assignee: Samsung Display Devices Co., Ltd., Suwon-si, Rep. of Korea

[21] Appl. No.: 861,626

[22] Filed: May 22, 1997

[30] Foreign Application Priority Data

Jul. 16, 1996 [KR] Rep. of Korea ................. 1996 28690

[51] Int. Cl.[6] .......................... G01R 27/08; G08B 21/00
[52] U.S. Cl. ........................ 73/40; 73/49.3; 324/525; 340/605; 340/636; 429/90
[58] Field of Search ............. 73/40, 49.2, 49.3; 324/691, 525; 340/605, 636; 429/90

[56] References Cited

U.S. PATENT DOCUMENTS

| | | | |
|---|---|---|---|
| 675,708 | 6/1901 | Blackwell | 429/90 |
| 684,697 | 10/1901 | McA Lloyd | 429/90 |
| 4,404,516 | 9/1983 | Johnson, Jr. | 324/54 |
| 4,525,814 | 7/1985 | Woodall | 367/20 |
| 4,595,996 | 6/1986 | Shaper | 340/604 |
| 4,695,787 | 9/1987 | Billet et al. | 324/557 |
| 4,727,006 | 2/1988 | Malinowski | 429/50 |
| 4,965,554 | 10/1990 | Darling | 340/604 |
| 5,081,422 | 1/1992 | Shih | 324/693 |
| 5,091,715 | 2/1992 | Murphy | 340/604 |
| 5,341,128 | 8/1994 | Keyser et al. | 340/605 |
| 5,378,995 | 1/1995 | Kudo et al. | 324/693 |
| 5,399,445 | 3/1995 | Tinker et al. | 429/90 |
| 5,444,378 | 8/1995 | Rodgers | 324/428 |
| 5,537,095 | 7/1996 | Dick et al. | 340/605 |
| 5,546,009 | 8/1996 | Raphael | 324/694 |

FOREIGN PATENT DOCUMENTS

| | | | |
|---|---|---|---|
| 5550582 | 4/1980 | Japan | 429/90 |
| 5951546 | 3/1984 | Japan | 429/90 |
| 0189875 | 9/1985 | Japan | 429/90 |

*Primary Examiner*—Hezron E. Williams
*Assistant Examiner*—J. David Wiggins
*Attorney, Agent, or Firm*—Christie, Parker & Hale, LLP

[57] ABSTRACT

The present invention relates to a system for sensing leakage which comes from a battery and flows in a battery pack. The system comprises a electrical leakage sensor for sensing whether a battery is leaking and outputting the sensed result; a leakage display for displaying in response to the leakage sensor; a leakage communicator for receiving the sensed result from the leakage liquid sensor and transmitting it to a portable electronic equipment. The leakage sensor either utilizes a conductive glass mat or a pair of complementary interdigitated electrodes disposed on the surface of such sensor. The system senses a leakage occurring from a battery and collecting at the bottom of a battery pack and displays the sensed result together with transmitting the sensed result to a portable electronic equipment.

12 Claims, 1 Drawing Sheet

BATTERY LEAKAGE SENSING SYSTEM

BACKGROUND OF THE INVENTION (a) Field of the Invention

This present invention relates to a battery leakage sensing system. More particularly, the present invention relates to a system which senses and displays information on whether a battery is leaking to the inner bottom of a battery pack.

(b) Description of the Related Art

In general, portable electronic equipment uses a primary battery (non-rechargeable battery) or a secondary battery (a rechargeable battery) as power supply. The batteries are secured from the outside by being embedded in battery packs which are installed in portable electronic equipment. The batteries are fixed to the battery packs for making sure that the power of the batteries is delivered to the host equipment in a safe manner.

However, the conventional art has problems in that the user can not see whether the battery is leaking until the user opens the battery pack. Consequently, the battery, the battery pack, and even the portable electronic equipment can be damaged due to the leakage.

If leakage is detected at the beginning, the battery, the battery pack, and the portable electronic equipment will be protected from any serious damage. However, the problem lies in that the leakage that occurs in the battery pack is not seen from the outside.

SUMMARY OF THE INVENTION

An object of the present invention is to provide a battery leakage sensing system which senses whether a battery is leaking to the inner bottom of a battery pack and displays the information along with transmitting the information to a portable electronic equipment, thereby protecting the battery, the battery pack, and the host equipment from any serious damage, in order to substantially obviate one or more of the problems due to limitations and disadvantages of the conventional invention.

In order to achieve the above object, the present invention includes a leakage sensor for sensing whether a battery is leaking and outputting the result; a leakage display for displaying in response to the leakage sensor; a leakage communicator for receiving the sensed result from the leakage sensor and transmitting the information to a portable electronic equipment.

BRIEF DESCRIPTION OF THE DRAWINGS

The preferred embodiments of the present invention will now be described more specifically with reference to the attached drawings, wherein.

DETAILED DESCRIPTION OF THE PREFERRED EMBODIMENTS

The preferred embodiments of the present invention will become apparent from a study of the following detailed description, when viewed in light of the accompanying drawings.

Figure 1:
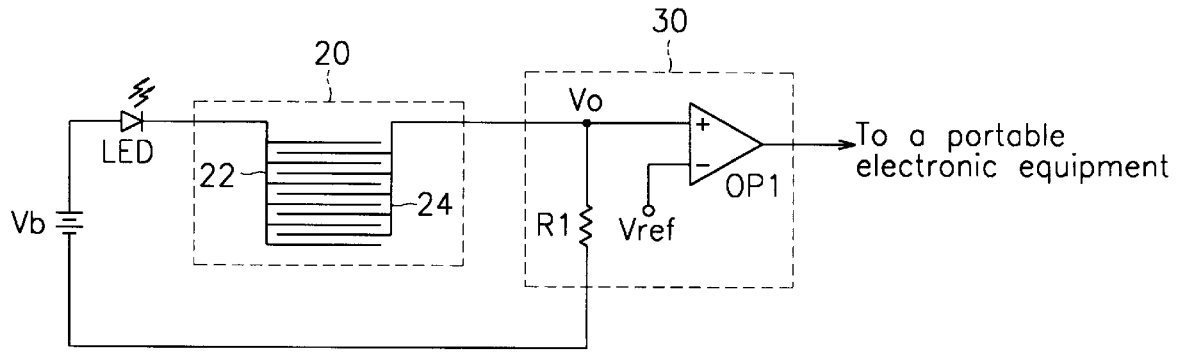
FIG. 1 is a block diagram illustrating a battery leakage sensing system in accordance with a preferred embodiment of the present invention.
Figure 2:
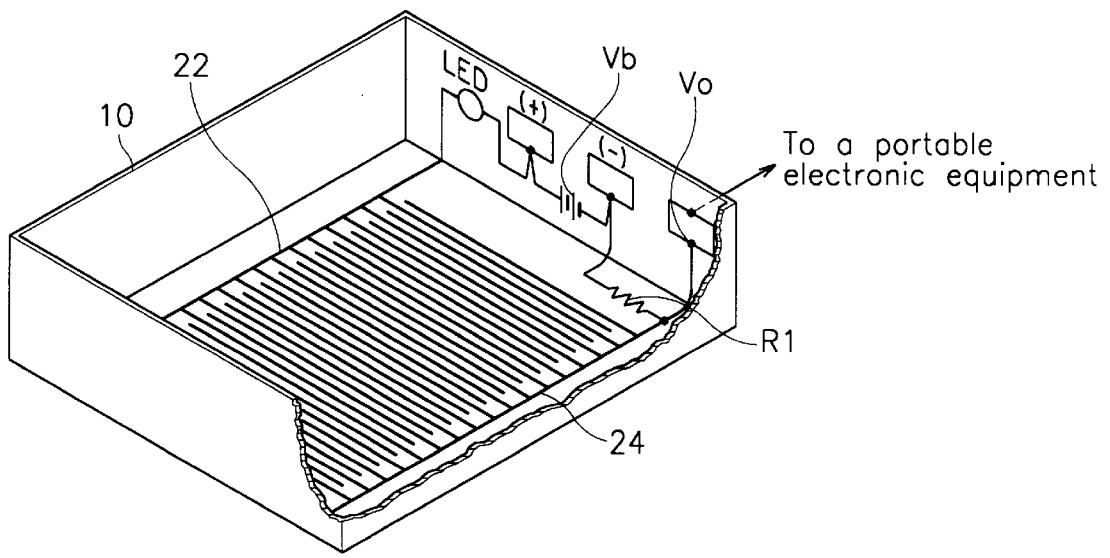
FIG. 2 shows a battery pack which is provided with a battery leakage sensing system in accordance with a preferred embodiment of the present invention.

As shown in FIG. 1 and FIG. 2, a battery leakage sensing system in accordance with the preferred embodiment of the present invention includes a leakage sensor 20, a light emitting diode (hereinafter LED) and a leakage communicator 30. Preferably, the leakage sensor 20 is constructed with a pair of complementary interdigitated electrodes disposed on the surface of the sensor.

The leakage sensor 20 is located at the inner bottom of a battery pack 10 for detecting battery leakage by allowing a current to flow.

The LED has an anode terminal connected to the positive terminal of power (Vb) and a cathode terminal connected to one terminal of the leakage sensor 20 for emitting light when the leakage sensor 20 allows the current to flow.

The leakage communicator 30 outputs information of the battery leakage, when the leakage sensor 20 allows the current to flow, to a portable electronic equipment. The leakage communicator 30 has a resistor (R1) and an operating amplifier (OP1). The resistor has one terminal connected to the other terminal of the leakage liquid sensor 20 and the other terminal connected to a negative terminal of power (Vb), and maintains a predetermined voltage (Vo) when the current flows through the leakage sensor 20. The operating amplifier (OP1) has a non-inverting terminal connected to one terminal of the R1 and an inverting terminal connected to a reference voltage (Vref) for amplifying the voltage difference between the voltage applied to the non-inverting terminal and the voltage applied to the inverting terminal, and then outputting the amplified voltage to the host equipment, portable electronics or indicating equipment.

Here, the operating amplifier (OP1) can be located at the battery pack 10 or the portable electronic equipment.

The leakage sensor 20 includes leakage sensing lines 22 and leakage sensing lines 24 which are positioned all over the inner bottom of the battery pack 10. Furthermore, the leakage sensor 20 is characterized with one terminal of the leakage sensing lines 22 connected to the LED and the other terminal opened and one terminal of the leakage sensing lines 24 connected to the resistor R1 and the other terminal opened.

Here, using a conductive glass mat or conductor which enables electricity to be conducted by means of the leakage, the leakage sensing lines 22 and the leakage sensing lines 24 are laid on a printed circuit board.

Hereinafter, the operation of the secondary battery leakage sensing system in accordance with the preferred embodiment of the present invention is explained in detail.

If leakage does not occur, current does not flow since the leakage sensing lines 22 and the leakage sensing lines 24 are not connected to each other. Thus, the LED does not emit indicating the battery is not leaking. The operating amplifier (OP1) of the leakage communicator also outputs to the host equipment the voltage representing that the battery is not leaking.

When the leakage occurs and the leakage runs around the inner bottom of the battery pack (10), the leakage sensing lines are turned ON by means of the leakage so that the current flows, thus allowing the LED to emit light. In this case, a warning device like a loudspeaker can also be provided to indicate the occurrence of the leakage.

Furthermore, the flow of current causes the resistor (R1) to maintain the predetermined voltage (Vo), which is then inputted into the non-inverting terminal of the operating amplifier (OP1).

The operating amplifier (OP1) amplifies the voltage difference between the reference voltage (Vref) inputted to the inverting terminal and the voltage (Vo) inputted to the non-inverting terminal. Then, the leakage communicator outputs the amplified voltage (Vout) to the portable electronic equipment indicating the occurrence of the leakage.

As described above, a battery leakage sensing system senses a battery leakage in a battery pack and displays the leakage information along with transmitting the information into a portable electronic equipment, thereby protecting the battery, the battery pack, and the host equipment from any serious damage.

What is claimed is:

1. A battery leakage sensing system, comprising:

a battery pack for receiving a battery;

a substantially flat electrical leakage sensor applied over a broad surface area for sensing whether a battery leaks and outputting a result, said sensor being located at a surface of the battery pack susceptible to leakage from a battery when a battery is installed in the battery pack;

said leakage sensor comprising a conductive glass mat which enables electricity to be conducted over said surface in event that any leakage occurs; and a leakage display for displaying the sensed result from the leakage sensor; and a leakage communicator for receiving the sensed result from the leakage sensor and transmitting the senseed result to an external device.

2. A battery leakage sensing system according to claim 1 wherein the leakage sensor includes a plurality of leakage sensing lines installed at an inner bottom of the battery pack, one of the leakage sensing lines having one terminal connected to the leakage display and another terminal opened, and a second one of the leakage sensing lines having one terminal connected to the leakage communicator and another terminal opened.

3. The battery leakage system of claim 1 further comprising a battery installed in the battery pack.

4. A battery leakage sensing system according to claim 2 wherein current flows between said one of the leakage sensing lines and said second one of the leakage sensing lines if leakage occurs from the battery.

5. A battery leakage system of claim 2 wherein a first set of said plurality of leakage sensing lines each have one terminal connected to the leakage display and another terminal opened, and wherein a second set of said plurality of leakage sensing lines each have one terminal connected to the leakage communicator and another terminal opened.

6. A battery leakage system of claim 2 wherein said leakage sensor covers substantially the entire inner bottom of the battery pack.

7. A battery leakage sensing system according to claim 4 wherein the leakage sensing lines are laid on a printed circuit board.

8. A battery leakage sensing system according to claim 5 wherein said first set of leakage sensing lines are multi-branched in parallel to each other from said one terminal connected to the leakage display and said second set of leakage sensing lines are multi-branched in parallel to each other from said one terminal connected to the leakage communicator, said first set of leakage sensing lines being alternately arranged with the second set of leakage sensing lines.

9. A battery leakage sensing system comprising:

a leakage sensor for sensing whether a battery leaks and outputting a result, said leakage sensor including a plurality of leakage sensing lines installed at an inner bottom of a battery pack, one of the leakage sensing lines having a first terminal and an open second terminal, and a second one of the leakage sensing lines having a first terminal and an open second terminal;

a leakage display for displaying the sensed result from the leakage sensor, said leakage display being connected to the first terminal of said one of the leakage sensing lines;

a leakage communicator for receiving the sensed result from the leakage sensor and transmitting the sensed result to portable electronic equipment, said leakage communicator being connected to the first terminal of said second one of the leakage sensing lines, and comprising, a resistor having one terminal connected to said second one of the leakage sensing lines of the leakage sensor and another terminal for connecting to a negative terminal of power for maintaining a predetermined voltage when current flows through the leakage sensing lines of the leakage sensor, and an operational amplifier having a non-inverting terminal connected to said one terminal of the resistor and an inverting terminal connected to a reference voltage for amplifying the difference between the predetermined voltage inputted to the non-inverting terminal and the reference voltage inputted to the inverting terminal, and outputting the amplified voltage to the portable electronic equipment.

10. A battery leaking sensing system according to claim 9 wherein the operational amplifier is located at the battery pack or the portable electronic equipment.

11. A battery leakage sensing system, comprising:

a battery container for receiving a battery;

an electrical leakage sensor, applied as a sheet that covers at least a portion of a surface of the battery container at a location susceptible to leakage from a battery when a battery is installed in said container, for sensing whether a battery leaks and outputting a result, said leakage sensor further comprising a pair of complementary interdigitated electrodes disposed over the surface of said leakage sensor;

a leakage display for displaying the sensed result from the leakage sensor; and a leakage communicator for receiving the sensed result from the leakage sensor and transmitting the sensed result to an external device.

12. The battery leakage system of claim 11 further comprising a battery installed in the battery container.

* * * * *